United States Patent
Tournemille et al.

(10) Patent No.: US 6,769,622 B1
(45) Date of Patent: Aug. 3, 2004

(54) SYSTEM AND METHOD FOR SIMULATING UNIVERSAL SERIAL BUS SMART CARD DEVICE CONNECTED TO USB HOST

(75) Inventors: Jerome Tournemille, Austin, TX (US); David Tamagno, Austin, TX (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/389,113

(22) Filed: Mar. 14, 2003

(51) Int. Cl.[7] .............................................. G06K 19/06
(52) U.S. Cl. ...................... 235/492; 710/100; 709/217; 713/172
(58) Field of Search ..................... 235/492; 710/100; 709/217; 713/172

(56) References Cited

U.S. PATENT DOCUMENTS

| | | | | |
|---|---|---|---|---|
| 5,847,372 | A | 12/1998 | Kreft | 235/492 |
| 6,168,077 | B1 | 1/2001 | Gray et al. | 235/375 |
| 6,266,721 | B1 * | 7/2001 | Sheikh et al. | 710/100 |
| 6,439,464 | B1 | 8/2002 | Fruhauf et al. | 235/492 |
| 6,516,357 | B1 * | 2/2003 | Hamann et al. | 710/2 |
| 2002/0066791 | A1 | 6/2002 | Leydier et al. | 235/492 |

FOREIGN PATENT DOCUMENTS

| | | | | |
|---|---|---|---|---|
| WO | WO 99/49415 | 9/1999 | | G06K/19/00 |
| WO | WO 01/96990 | 12/2001 | | G06F/1/00 |

OTHER PUBLICATIONS

Abbott (WO 01/96990).*
Sarat (WO 99/49415).*
Sarcanin (US PG Pub 2003/0145205)*

* cited by examiner

*Primary Examiner*—Karl D. Frech
*Assistant Examiner*—Daniel A. Hess
(74) *Attorney, Agent, or Firm*—Lisa K. Jorgenson; Christopher K. Regan (57) ABSTRACT

A system and method simulates a universal serial bus (USB) smart card device connected to a USB host device for development and debugging and includes a computer simulator and USB host device with host controller operatively connected along a communications link with the computer simulator for transmitting or receiving data packets to or from the computer simulator. A microcontroller is located between the computer simulator and USB host device and translates the data packets into a USB protocol to be used by the USB host device and defined by the computer simulator.

40 Claims, 4 Drawing Sheets

SYSTEM AND METHOD FOR SIMULATING UNIVERSAL SERIAL BUS SMART CARD DEVICE CONNECTED TO USB HOST

FIELD OF THE INVENTION

This invention relates to the field of smart cards, and more particularly, this invention relates to a system and method for simulating USB smart cards.

BACKGROUND OF THE INVENTION

Smart cards are plastic cards having an embedded Integrated Circuit (IC). That IC may be a logic circuit with its associated memories or a microcontroller with its associated memories and software, or a microcontroller with its associated memories and software coupled to a custom circuit block or interface.

To use the computing power of the IC, a smart card makes use of a full set of packaging technologies. For example, the die size varies from 1 $mm^2$ to 30 $mm^2$, but is limited because of the mechanical limitations imposed by the plastic construction of the smart card. The IC is attached to a lead frame and wire-bonding techniques are used to connect the IC pads to the lead frame contacts. Potting or other strengthening methods can be used to protect the IC against chemical and mechanical stresses during manufacturing and are a part of everyday usage of a smart card. Eight contacts are located on one side of the card. The smart card performs transactions with a smart card reader using a serial protocol. The mechanical and electrical specifications for a smart card are published by the International Standard Organization (ISO) as ISO7816-X standards, which have allowed the simple and massproduced magnetic stripe cards to evolve toward the smart card. This natural evaluation has allowed smart cards, depending of the IC complexity, of course, to perform pre-paid accounting, cryptographic scheme, personal authentication using a PIN code, biometrics, and java scripts, for example.

ISO documents ISO 7816-1 Physical Characteristics, ISO 7816-2 Dimensions and Locations of the contacts, ISO 7816-3 Electronic signals and transmission protocols, ISO 7816-4 Interindustry Commands for Interchange, and ISO 7816-10 Electronic signals and answer to reset for synchronous cards are incorporated herein by reference.

In operation, smart card readers are recognized by the reader infrastructure or a host computer prior to performing any transaction involving a smart card. The infrastructure runs an application involving the smart card. The half duplex protocol between the smart card and the smart card reader, in which either the smart card sends information to the smart card reader or vice versa, cannot start until a smart card is in place and detected by the smart card reader. The infrastructure manages authentication or transactions for pre-paid cards in public telephony, for Bankcards in Point-of-Sale (POS) terminals and Automatic Teller Machines (ATM), for Pay TV providers in set top boxes, and for wireless telecom operators in Subscriber Identification Modules (SIM) used in Global System for Mobile (CSM) terminals. Except for SIM cards, all other smart card reader applications use a physical sensor to detect the smart card. This sensor tells the smart card reader when a smart card is in place, i.e., when the smart card lead frame contacts mate with the smart card reader contacts.

When the smart card reader has established that a smart card is in place, a power-up sequence begins. After this power-up sequence has finished, the smart card reader typically provides a clock to the smart card and releases a reset signal. The smart card then executes its stored Operating System (OS). The SIM card, on the other hand, is in place only once with the power-off and used constantly subsequent to its positioning.

The first application for smart card technology was the public telephone system. The smart card die size was typically less than 1 $mm^2$, and only memories and logic circuits were integrated in the IC. The smart card reader used all eight contacts to interface properly with the different smart card generations. When the smart card was inserted in the payphone, the telephone infrastructure authenticated the smart card and the telephone removed "units" from the smart card.

The banking industry subsequently adopted smart cards. The die size was about 10 $mm^2$, and a microcontroller and its associated memories and software were integrated in the IC. The smart card reader used up to six contacts to interface properly with the different smart card generations. When a smart card was inserted in the ATM or the POS (point-of-sale), the smart card user was authenticated with a PIN code. The smart card could store different items, such as the balance of cash received from an ATM on a per week basis or details of purchases since a last closing date. Based on this information, authorization could be issued on the spot once the PIN had authenticated the debtor. This was accomplished without telephone calls to the bank.

Another application for smart cards has been developed by GSM manufacturers. The die size in a SIM is about 30 $mm^2$, and a microcontroller and its associated memories and software are integrated in the IC. The SIM reader uses five contacts to interface properly with the smart card. The more sophisticated smart card applications are performed in GSM using Java applets.

A new market for the smart card has emerged with the growth of the internet accessed from a personal computer. Secure message, Public Key Infrastructure, Authentication and Electronic Payment are new smart card areas of interest. The smart card acts as an e-commerce facilitator. One advantage of a smart card compared to other solutions is the smart card PIN located in its memory that is never communicated in any transaction.

Presently, a smart card is inserted into a smart card reader connected to a host computer. Two protocols are involved in supporting transactions between the smart card and host computer. The first protocol complies with the ISO-7816-3, which provides detailed requirements for the serial interface between smart card and smart card reader. The reader is connected to the computer via a serial port, a parallel port, or the Universal Serial Bus (USB), using a second protocol. The smart card reader contains electronic circuits and embedded software that enable communication between the smart card using the first protocol and the host computer using the second protocol. The host computer is loaded with any appropriate drivers to support the smart card reader.

Many countries have begun to use the smart card in the PC environment. The die size used in these applications ranges from 5 $mm^2$ to 30 $mm^2$, and the microcontroller and its associated memories and software are integrated in the IC typically with a cryptocontroller. Sometimes, a bio-sensor is integrated. The smart card reader uses at least five contacts to interface properly with the smart card in these applications.

Since the late 1990's, the universal serial bus (USB) has become firmly established and has gained wide acceptance in the PC marketplace. The USB was developed in response to a need for a standard interface that extends the concept of "plug and play" to devices external to a PC. It has enabled users to install and remove external peripheral devices without opening the PC case or removing power from the PC. The USB provides a low-cost, high performance, half-duplex serial interface that is easy to use and readily expandable.

USB uses four wires. The power supply is carried with two wires (VBus and ground), and data is carried with the other two wires (D+, D−). The latest version of the USB is currently defined by the Universal Serial Bus Specification Revision 2.0, written and controlled by USB Implementers Forum, Inc., a non-profit corporation founded by the group of companies that developed the USB Specification.

In particular, Chapter 5 USB Data Flow Model, Chapter 7 Electrical, Chapter 8 Protocol Layer and Chapter 9 USB Device Framework of Universal Serial Bus Specification are incorporated herein by reference. The increasingly widespread use of the USB has led smart card reader manufacturers to develop USB interfaces for connection of their products to host computers to complement the existing serial and parallel interfaces.

Because the USB protocol is becoming increasingly important, it is necessary to develop products involving complex smart card devices for use with USB systems. To produce a functional equivalent of a smart card before the final product is available and any chips are manufactured, a simulator is developed on a software development computer and acts to "simulate" the behavior of the smart card. After the smart card program is assembled or compiled, the output is sent to the smart card simulator, which interprets the instructions it finds and runs the program to a break point (e.g., a stop or normal execution interrupt), or allows a user to single step the program and watch a change of state of the simulated smart card device. The communication interfaces of the smart card, including the various default pipe, pipe bundles, and USB wire are accomplished with the simulated software and associated devices.

Prior art solutions for developing USB smart card simulation programs and devices, USB smart card contacts, and software have included systems that simulate a "virtual USB host" and software that communicates with a smart card USB peripheral. Another prior art solution runs the program on a chip emulator as a step between running the smart card program in the simulator and running it on a smart card itself. The chip emulator contains the actual chip or design of the chip in a manner that will allow the tester to examine the internal state of the chip and single step the program. In the USB smart card context, the emulator is connected to a real USB host.

These prior art devices or systems often do not allow faithful and complete functionality adhering to all aspects of USB specifications. They often require a large number or enhanced processing power of hardware peripherals and require, in some cases, a "virtual USB host" to send the USB traffic to the simulator. If a "virtual USB host" is created, a possible wrong interpretation of the USB specification could be implemented. In some cases, several different operating behaviors of the virtual USB host must be developed because each computer operating system would implement a USB host having a different operating behavior. Even when a chip emulator is used, use of the emulator would still require a final debugging step.

It has also been known that depending upon capabilities built into software, virtual devices, such as a "virtual USB host," can exhibit different synchronization behaviors with actual physical devices. As a result of these and other problems, there is an inability to debug and validate embedded software with a simulator while in the context of the current environment or a final application for a USB smart card device. There is also the inability to use the simulator in the environment adhering to all aspects of the USB specifications. There is also the problem of connecting the simulator to a real USB host device and the resultant inability to debug and validate the USB PC driver of the final application using the simulator. Any USB system works as a slave/master system, and thus, it is impossible for two devices acting as master devices to communicate in the USB protocol.

SUMMARY OF THE INVENTION

It is therefore an object of the present invention to provide communications between a USB smart card simulator running on a software development computer and USB host controller that overcomes the disadvantages of prior art solutions noted above.

The present invention is advantageous and simulates a universal serial bus (USB) smart card device connected to a USB host device for development and debugging. A computer simulator has software that simulates a USB smart card device. The USB host device includes a USB host controller operatively connected along a communications link with the computer simulator for transmitting or receiving data packets to or from the computer simulator. A microcontroller is located in the communications link between the computer simulator and the USB host device and translates the data packets into a USB protocol to be used by the USB host device and defined by the computer simulator.

In one aspect of the present invention, the microcontroller can be a serial/USB translator interconnected between the computer simulator and the USB host device. The computer simulator can include a serial port connected to a serial communications line that is, in turn, connected to the microcontroller. The USB communications link can extend between the serial/USB translator and the USB host device.

In yet another aspect of the present invention, the microcontroller is operative for supporting control, bulk, interrupt, and/or isochronous USB transfer modes. A serial and USB peripheral can be controlled by the microcontroller.

In yet another aspect of the present invention, the microcontroller comprises a USB/USB translator. Two USB peripherals can be controlled by the microcontroller. A USB host controller can be operative with the computer simulator and connected to the communications link.

In yet another aspect of the present invention, the microcontroller has input and output software stacks for recording and aiding data packet transfers. The software stacks can store data regarding packet type, data payload, endpoint address, endpoint number and/or transfer state within each software stack.

A method for simulating a USB smart card device connected to a USB host device for development and debugging is also set forth.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention advantageously provides communication between a USB smart card simulator running on a software development computer and a USB host controller. In accordance with the present invention, one of the peripherals in the software development computer sends data to a USB host controller via a hardware connection. Because the software development computer does not have a USB device interface, a protocol translation is required between the software development computer and the host computer with the USB host controller.

The present invention allows faithful and complete functionality, adhering to all aspects of the USB specification, including Universal Serial Bus Specification Revision 2.0. It allows a smart card software developer to develop and debug any code before the actual silicon chip is a final, physically tangible product. It does not require a large number of hardware peripherals or operating capability because most of the application is performed by software. It is not required to develop a "virtual USB host" to send USB traffic to the simulator, and as a result, there is no risk of a wrong interpretation of the USB specification when developing a virtual USB host. There is also no requirement to develop several operating behaviors of a virtual USB host as required in prior art solutions where each computer operating system would implement a USB host with a different operating behavior.

The present invention also allows debugging and validation in the current environment of a final application and allows debugging and validation of a USB PC driver using the simulator. It is lower in cost than many prior art solutions because not only is there no final debugging step, but also a chip emulator is no longer required to run the smart card software program. The "time to market" from development to the complete product, including the chip, driver, smart card application and other associated developments, is improved as a result of the present invention.

Figure 1:
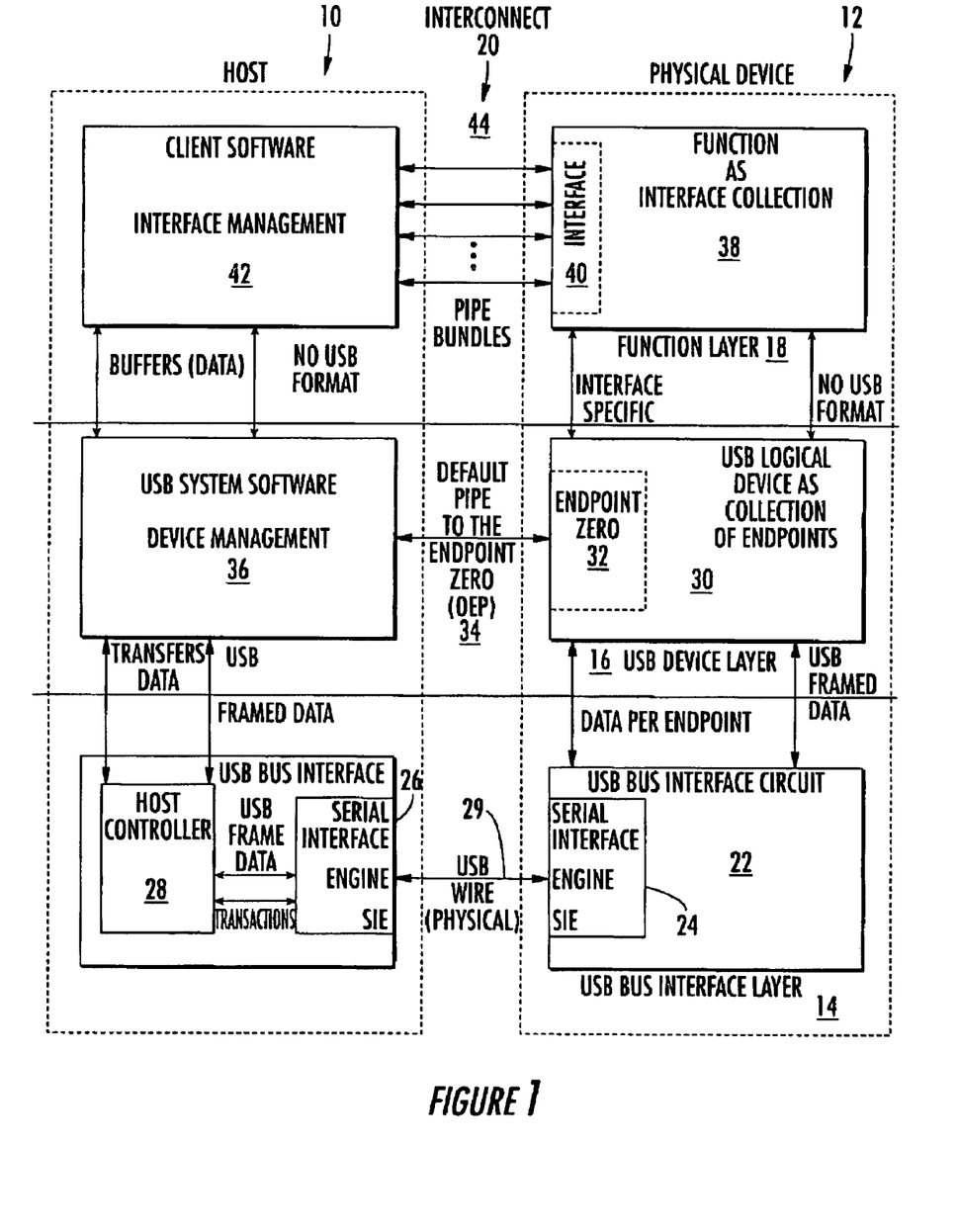
FIG. 1 is a block diagram of a USB host/device showing various data transport mechanisms, pipes, and the USB-relevant format of transported data between the host and interconnected physical device as used in the Universal Serial Bus Specification Revision 2.0.

For purposes of background and reference, the basic USB data flow between a USB host and a USB device and the various implementations and layers in accordance with Universal Serial Bus Specification Revision 2.0 are set forth in FIG. 1.

As shown in FIG. 1, the connection of a host 10 to a physical device 12 requires the interaction between different layers, i.e., the USB bus interface layer 14, USB device layer 16, and function layer 18. An interconnect 20 between the host and device is illustrated.

The USB bus interface layer 14 includes a USB bus interface circuit 22 and serial interface engine (SIE) 24 at the device 12 that communicates with a serial interface engine (SIE) 26 and its host controller 28 at the host 10 via a physical wire 29. The USB device layer 16 includes at the physical device 12 a collection of endpoints as a USB logical device 30. An endpoint zero 32 is operable in communication via the default pipe 34 to USB system software 36 that is operable for device management at the host 10. The function layer 18 includes at the physical device 12, a logical function 38 as an interface collection, and the interface 40 that communicates via a plurality of pipe bundles 44 to client software 42 that is operable for interface management.

The USB bus interface layer 14 provides the physical wire 29 for the traffic signaling and packet conductivity between the host 10 and physical device 12. The USB device layer 16 views the USB system software 36 to perform generic USB operations with the physical device 12 via the default pipe 34 to endpoint zero 32. The functional layer 18 adds capabilities to the host using matched client software. The USB Device Layer 16 and Function Layer 18 each view logical communications within their layers and use the USB Bus Interface Layer 14 for any data transfer. The USB host 10 coordinates the overall USB system, controls access, and monitors the USB topology.

Logical communications exist between the client software and the Function Layer 18 and the USB system software 36 and USB logical device 30. Actual packets flow between the USB host controller 28 and the USB bus interface circuit 22.

As is known, USB physical devices add functionality to the host and have the same interface. Each physical device carries and reports configuration-related data, which it forwards to the host to allow the host to identify and configure the USB device. Typically, devices on the USB are connected to a host using a tiered star topology, including the hub. The host, on the other hand, communicates with each logical device as if it were directly connected to a root port. The client software manipulates a USB function interface of a device only as an interface of interest.

It should be understood that the actual communication flows across several interface boundaries. The two software interfaces for the host are a host controller driver (HCD) and a USB driver (USBD). A software interface between a USB host controller 78 and USB system software 76 implements the host controller driver and allows the host controller to implement functions without requiring the host software to be dependent on any particular implementation One USB driver can support different host controllers. Specific knowledge of a host controller implementation is not required.

The USB logical device 30 can be considered a collection of endpoints and are grouped into endpoint sets to implement the interface. The USB system software 36 manages or controls the device using the default pipe 34 to the endpoint zero 32. Client software 42 manages the interface using pipe bundles 44 associated with an endpoint set. Data is moved between a buffer on the host 10 and an endpoint on the USB device 12 when client software requests the data. The host controller 28 or USB device 12, depending on the direction of data transfer, packetizes the data and forwards the packets over the bus. It also coordinates bus access. The host communicates with the physical device using a desired communication that is designed to match any communication requirements of the physical device and transfer characteristics provided by a USB.

The endpoint is an identifiable portion of the device that terminates the communication between the host. It can be a collection of independent endpoints. Default control uses input and output endpoints and the endpoint number "zero" as part of the default pipe 34.

The data transport mechanism includes transfers of data between the host controller 28 and the USB system software 36 at the host 10. Buffers can be used as a data transport mechanism between the USB system software 36 and the client software 42 at the host 10. The other data transport mechanism includes transactions between the host controller 28 and the serial interface engine 26 within the USB bus interface of the host.

The data transport mechanism also exists as a data per endpoint between the USB bus interface circuit 22 and the USB logical device 30 at the physical device 12. The data transport mechanism between the function 38 (and with the interface 40) and the endpoint zero 32 is interface-specific.

USB-relevant format of transported data occurs as USB frame data between the serial interface engine 26 and the host controller 28 and between the host controller 28 and the USB system software 36 at the host 10. No USB format of transporting data exists between the client software 42 that manages an interface and the USB system software 36.

At the device 12, USB-relevant format of transported data exists as USB frame data between the USB bus interface circuit 22 and the USB logical device 30. No USB format of data occurs between the interface 40 and the endpoint zero 32 at the device 12.

Further details of the functioning of the USB host and device and data flow can be found in the Universal Serial Bus Specification Revision 2.0, Chapter 5 entitled "USB Dataflow Model," the disclosure which is hereby incorporated by reference in its entirety.

Figure 2:
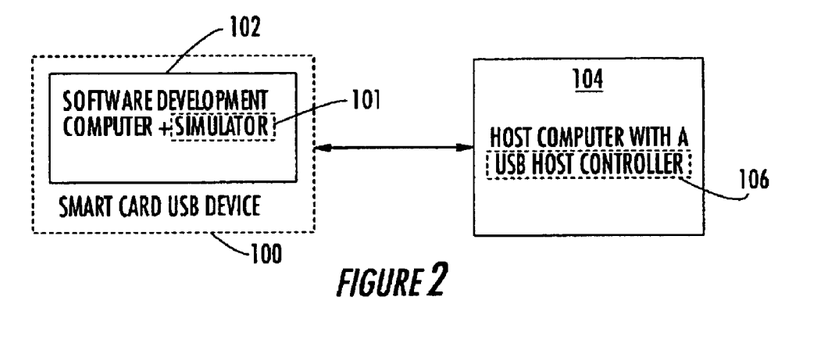
FIG. 2 is a high level block diagram of the present invention showing a software development computer and simulator as a smart card USB device connected to a host computer and USB host controller.

The present invention incorporates functionality for simulating a smart card or Universal Serial Bus smart card device (USD) 100 and provides communications between a USB smart card simulator 101 as software running on a software development computer 102 and a host computer 104 having a USB host controller 106 as shown in FIG. 2.

Figure 3:
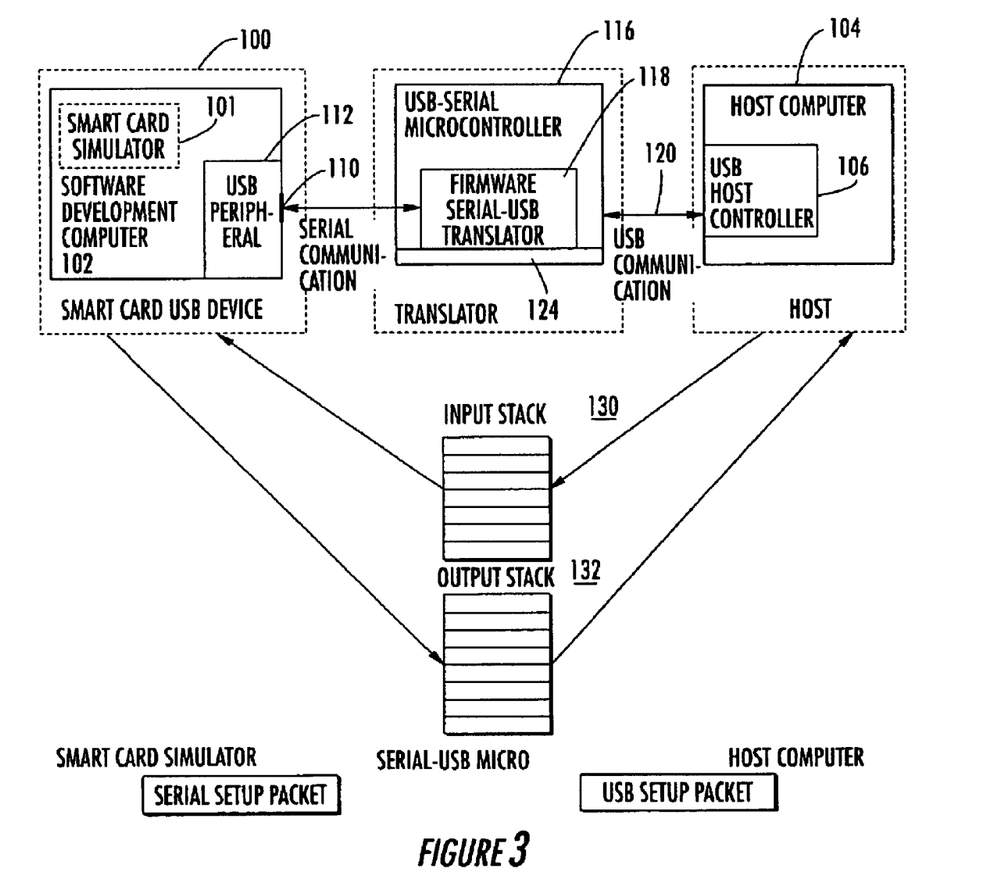
FIG. 3 is a block diagram of a first embodiment of the present invention using a software development computer, USB-SERIAL microcontroller, and host computer, and showing input and output stacks.

As shown in FIG. 3, a first embodiment is illustrated where one of the serial ports 110 of the software development computer 102 sends or receives data to or from a simulator 101 via a USB peripheral 112. The data is transmitted on a serial cable 114 to a chip microcontroller as a USB-SERIAL microcontroller 116, which acts as a protocol translator. It includes firmware 118 for translating the serial protocol into a USB protocol. The chip or USB-SERIAL controller 116 communicates to the USB host computer 104 using the USB protocol defined into the simulator and through a USB cable 120. As illustrated, the software development computer 102 includes the smart card simulator 101 and the USB peripheral 112. The items communicate with the firmware 118 as part of the USB, SERIAL microcontroller 116. The USB-SERIAL microcontroller 116 performs the translation and includes a serial and a USB peripheral 124. The USB peripheral must have the same features as the product to simulate. For example, the microcontroller should support the four USB transfer modes of control, bulk, interrupt and isynchronous transfer modes.

A special protocol is defined to transfer USB information over the serial communication link. For example, not only must information regarding the type of transfer be forwarded, but also the cyclic redundancy check (CRC) must be forwarded. There are some speed limitations because the serial interface RS232 works at a maximum speed of 115 Kbit/s while the full speed of USB is 12 Mbit/s (and 40 Mbits/s for USB Specification Revision 2.0). The simulator speed depends on the computer peripheral speed and of the implementation of the simulator.

As noted before, the USB-SERIAL microcontroller 116 must have the same hardware configuration, i.e., the same endpoints number, endpoints type, and other factors, as the USB smart card simulator 101. The firmware of the USB-SERIAL microcontroller 116 implements two software stacks as an input stack 130 and an output stack 132 (FIG. 3). Each stack item will give the following information:

a) packet type (control, bulk, interrupt, isynchronous);
b) data payload;
c) endpoint address;
d) endpoint number; and
e) the transfer state (i.e., which transaction and which packet is in the transaction).

The input stack 130 records all transfers from the host computer 104 to the USB-SERIAL microcontroller 116. The host computer 104 will send USB packets to the USB-SERIAL microcontroller 116. The microcontroller firmware 118 decodes the USB packet and fills the input stack 130. The USB-SERIAL microcontroller reads the input stack 130 and converts it into a serial packet and forwards it to the smart card simulator 101.

The output stack 132 records the transfers from the smart card simulator 101 to the USB-SERIAL microcontroller 116. The smart card simulator 101 forwards serial data to the USB-SERIAL microcontroller, where its firmware 118 decodes the serial packet and fills the output stack 132. The USB-SERIAL microcontroller 116 reads the stack and converts it into USB format and forwards data to the host computer 104.

In order to simulate a single ended zero (SE) in a suspend mode, a special flag can be sent to the host computer. The single ended zero bus state is operative with the start of packet (SOP) and end-of-packet (EOP). The end-of-packet could be signaled by driving D+ and D− to a SCO state for two bit times. The lines to the J state can be driven for one bit time. This transition from the single ended zero to the J state defines an end-of-packet as received. The J state can be asserted for one bit time, while any D+ and D− output drivers are in a high impedance state. As to a suspend mode, a bus termination resistor could hold a bus in an idle state. Devices can be in a suspend mode (or state) from any powered state. For example, the entire bus could be placed in a suspend state by ceasing transmissions, including a start-of-frame token. There could be a global suspend and a selective suspend followed by resume.

Figure 4:
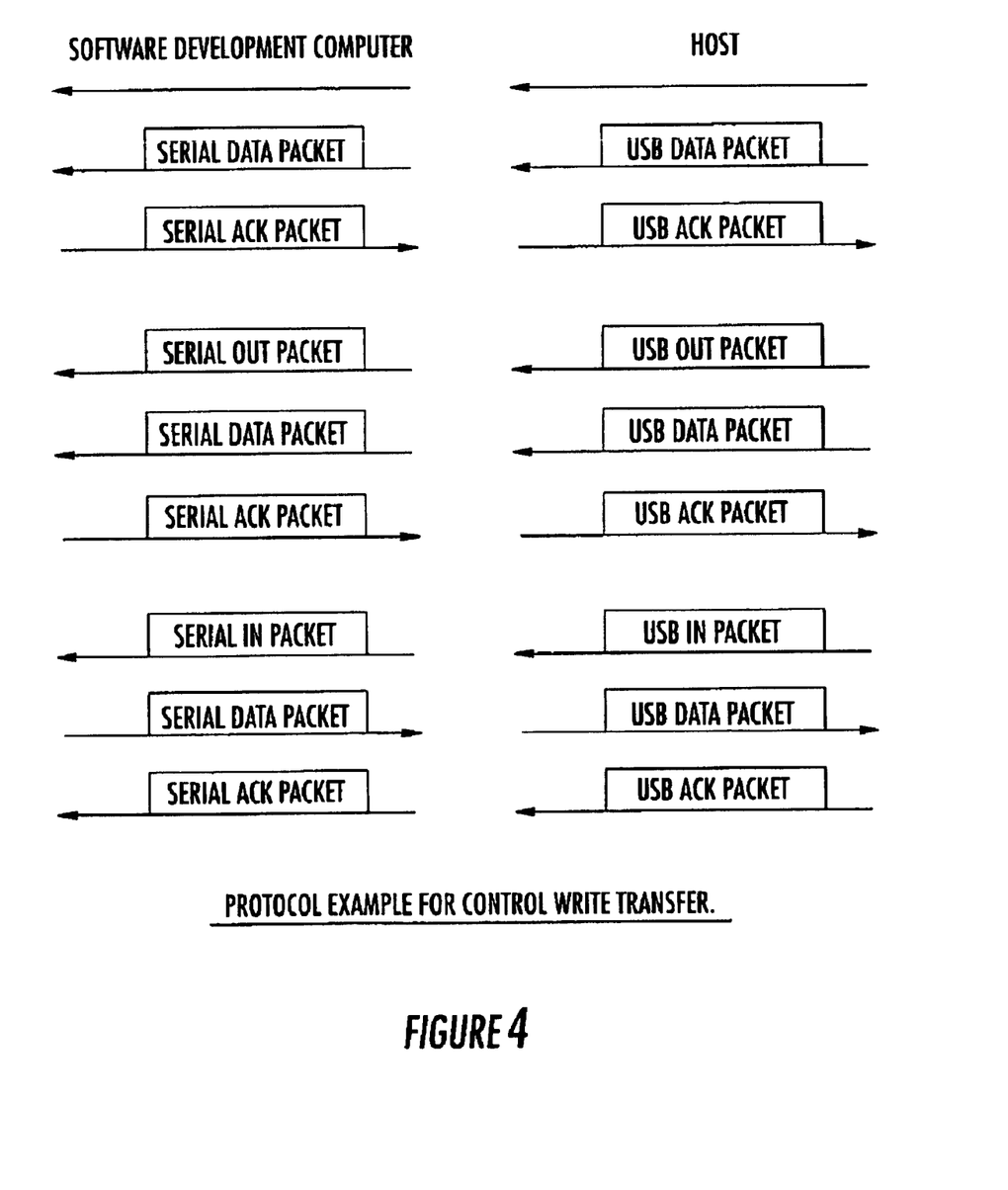
FIG. 4 is a protocol example for a control write transfer that can be used with the present invention.

FIG. 4 shows a protocol example for a control write transfer between the smart card USB device and the host of FIG. 3. It is shown that the USB data packet is translated to the serial data packet. A serial ACK packet is translated to the USB ACK packet. Throughout the time frame, which is advancing downward in this protocol example, the translation occurs from the USB packet to the serial packet, such as for the OUT, data, ACK, IN, data and ACK packets.

It should be understood that the bottle neck for data transfer using the embodiment shown in FIG. 3 is located at the simulator. It is required to implement special buffer features in the simulator 101 to keep a record of all data coming from the USB host 104.

Figure 5:
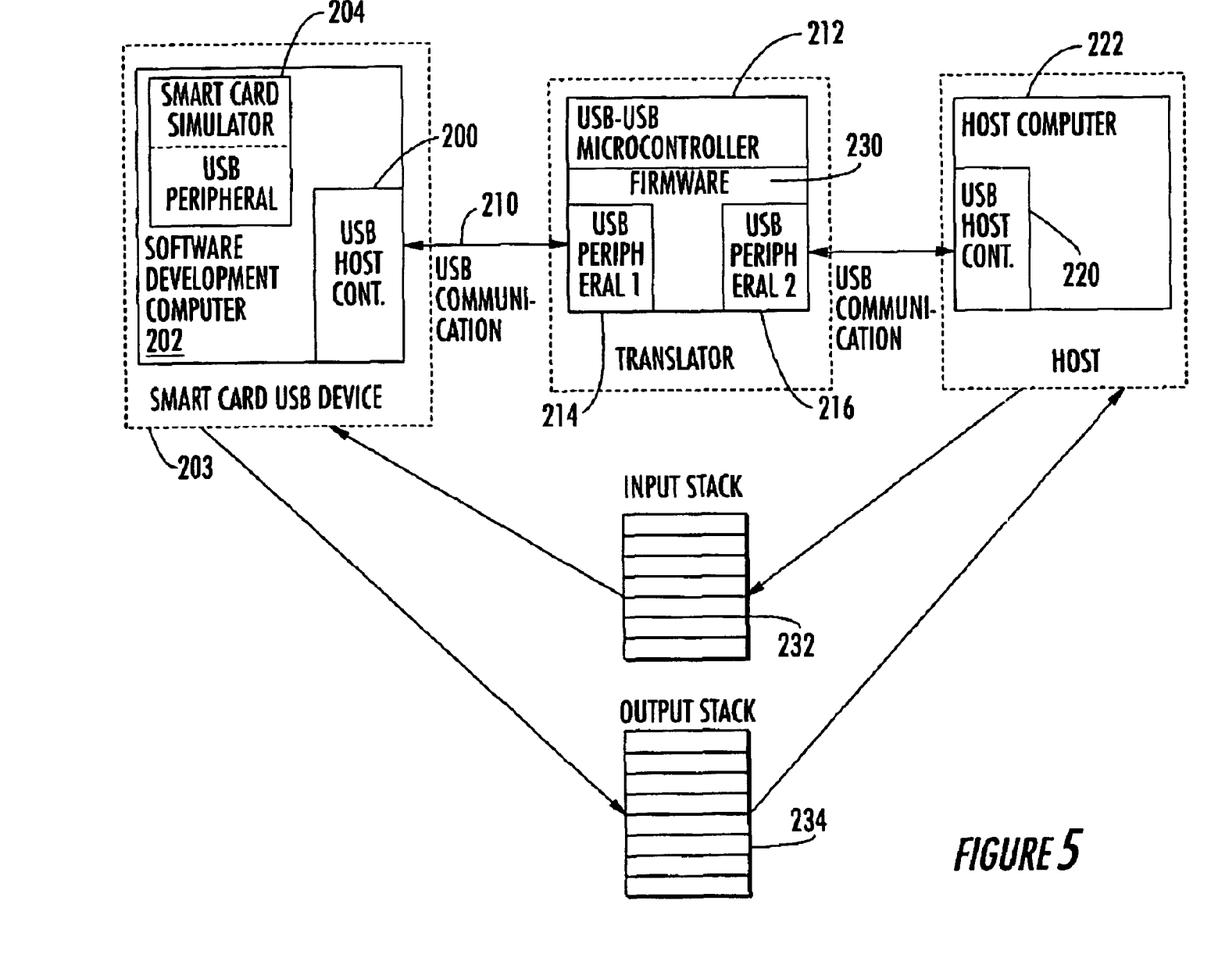
FIG. 5 is a block diagram of a second embodiment of the present invention similar to FIG. 3, and using a software development computer, but using USB-USB microcontroller connected to the host computer, and showing input and output stacks.

The second embodiment shown in FIG. 5 addresses this issue by using a USB host controller 200 of a software development computer 202 forming the smart card USB device 203 to send or receive the data to or from the smart card simulator 204. The communication speed is 12 Mbits/s (or 40 Mbits/s) instead of 115 Kbits/s used with the simulator and embodiment of FIG. 3.

The data is transmitted on a USB cable 210 to a USB device that is a chip microcontroller operable as a USB-USB microcontroller 212, which manages two USB peripherals 214,216. The USB-USB microcontroller 212 communicates to a USB host controller 220 of the host computer 222 using the USB protocol defined in the simulator. The USB-USB microcontroller 212 coordinates the data transfer between both USB peripherals 214,216. One of the USA peripherals must have the same features as the simulated product, and thus, the USB-USB microcontroller typically supports all USB transfer modes (control, bulk, interrupt and isynchronous).

The firmware 230 of the USB-USB microcontroller 212 could implement two software stacks as shown in FIG. 5, an input stack 232 and output stack 234. Each stack item could hold an entire USB packet.

As shown in the embodiment of FIG. 5, the USB-USB microcontroller 212 coordinates the data transfer between USB peripherals. A protocol can define the transfer of USB information over the USB channel between the smart card simulator 204 and the USB-USB microcontroller 212. The recommended configuration of the USB peripheral is a control transfer endpoint to configure the USB-USB microcontroller 212. An interrupt transfer endpoint in the IN direction knows when the USB host controller 220 tries to send a command to the smart card simulator. This guarantees that the smart card simulator 204 will request data with minimal delay. Bulk transfer endpoints (IN and OUT) transfer large amounts of data.

The firmware 230 of the USB-USB microcontroller 212 implements the two software stacks as the input stack 232 and the output stack 234. Each stack item holds an entire USB packet data. An interrupt IN transfer is accomplished between the smart card simulator 204 and the USB-USB microcontroller 212. It does not have a noticeable delay between the host computer 222 sending a packet and the smart card simulator 204 answering to the packet. For example, when a host computer 222 forwards a packet to the USB-USB microcontroller 212, the packet and USB transfer type are stored in the input stack 232. When the interrupt transaction occurs, the first stored packet is forwarded to the smart card simulator 204.

The smart card simulator 204 also answers to the host computer 222. It sends the answer packet in the USB type specified by the USB transfer type to the USB-USB microcontroller 212 and stores the packet in the output stack 234. The packet is sent to the host computer in its current format. The USB communication between the USB-USB microcontroller 212 and the host computer 222 is the real USB communication for the final chip. To simulate a single ended zero in the suspend mode, a special flag is sent to the host computer.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A system that simulates a universal serial bus (USB) smart card device connected to a USB host device for development and debugging comprising:
   a computer simulator having software that simulates a USB smart card device;
   a USB host device having a USB host controller operatively connected along a communications link with the computer simulator for transmitting or receiving data packets to or from the computer simulator; and
   a microcontroller located in the communications link between the computer simulator and the USB host device for translating the data packets into a USB protocol used by the USB host device and defined by the computer simulator.

2. A system according to claim 1, wherein the microcontroller comprises a serial/USB translator interconnected between the computer simulator and the USB host device.

3. A system according to claim 2, wherein the computer simulator includes a serial port and said communications link comprises a serial communications line operatively connected to said serial port and said serial/USB translator.

4. A system according to claim 2, wherein said communications link further comprises a USB communications link between the serial/USB translator and said USB host device.

5. A system according to claim 2, and further comprising a serial and USB peripheral controlled by said microcontroller.

6. A system according to claim 1, wherein said microcontroller is operative for supporting control, bulk, interrupt, and/or isochronous USB transfer modes.

7. A system according to claim 1, wherein said microcontroller comprises a USB/USB translator.

8. A system according to claim 7, and further comprising two USB peripherals controlled by said microcontroller.

9. A system according to claim 7, and further comprising a USB host controller operative with said computer simulator and connected to said communications link.

10. A system that simulates a universal serial bus (USB) smart card device connected to a USB host device for development and debugging comprising:
    a computer simulator having software that simulates a universal serial bus smart card device;
    a USB host device having a USB host controller operatively connected along a communications link with the computer simulator for transmitting or receiving data packets to or from the USB host device; and
    a microcontroller located in the communications link between the computer simulator and the USB host device for translating the data packets into a USB protocol to be used by the USB host device and defined by the computer simulator and having input and output software stacks for recording and aiding data packet transfers.

11. A system according to claim 10, wherein said software stacks store data regarding one of at least packet type, data payload, endpoint address, endpoint number or transfer state within each software stack.

12. A system according to claim 10, wherein the microcontroller comprises a serial/USB translator interconnected between the computer simulator and the USB host device.

13. A system according to claim 12, wherein the computer simulator includes a serial port and said communications link comprises a serial communications line operatively connected to said serial port and said serial/USB translator.

14. A system according to claim 12, wherein said communications link further comprises a USB communications link between the serial/USB translator and said USB host device.

15. A system according to claim 12, and further comprising a serial and USB peripheral controlled by said microcontroller.

16. A system according to claim 10, wherein said microcontroller is operative for supporting control, bulk, interrupt, and/or isochronous USB transfer modes.

17. A system according to claim 10, wherein said microcontroller further comprises a USB/USB translator.

18. A system according to claim 17, and further comprising two USB peripherals controlled by said microcontroller.

19. A system according to claim 17, and further comprising a USB host controller operative with said computer simulator and connected to said communications link.

20. A method for simulating a universal serial bus (USB) smart card device connected to a USB host device for development and debugging comprising the steps of:

simulating within a computer simulator a USB smart card device;

transmitting or receiving data packets to or from the computer simulator and a USB host controller of a host device; and translating the data packets at a microcontroller interconnected between the computer simulator and the USB host device into a USB protocol used by the USB host device and defined by the computer simulator.

21. A method according to claim 20, and further comprising the step of translating the data packets within a microcontroller operative as a serial/USB translator.

22. A method according to claim 21, and further comprising the step of transmitting or receiving data packets over a serial communications line into or from a serial port of the computer simulator.

23. A method according to claim 21, and further comprising the step of transmitting data packets to or from the computer simulator along a serial communications link to the microcontroller and transmitting data packets to or from the USB host controller along a USB communications link using a USB protocol defined by the computer simulator.

24. A method according to claim 20, and further comprising the step of supporting within the microcontroller control, bulk, interrupt and/or isochronous USB transfer modes.

25. A method according to claim 20, and further comprising the step of controlling a serial and a USB peripheral by the microcontroller.

26. A method according to claim 20, and further comprising the step of translating data packets within a microcontroller operative as a USB/USB translator.

27. A method according to claim 26, and further comprising the step of controlling two USB peripherals by the microcontroller.

28. A method according to claim 26, and further comprising the step of transmitting or receiving data packets over a USB communications line into or from a USB host controller operative with the computer simulator.

29. A method according to claim 20, and further comprising the step of simulating a single ended zero and/or suspend mode by sending a flag to the host device.

30. A method for simulating a universal serial bus (USB) smart card device communicating with a USB host device for development and debugging comprising the steps of:

simulating within a computer simulator a USB smart card device;

forwarding or receiving data packets to or from the computer simulator and a USB host controller of a host device; and translating the data packets at a microcontroller interconnected between the computer simulator and the USB host device into a USB protocol used by the USB host device and defined within the computer simulator while using input and output software stacks for recording and aiding data packet transfers.

31. A method according to claim 30, and further comprising the step of storing information regarding one of at least packet type, data payload, endpoint address, endpoint number or transfer state within each software stack.

32. A method according to claim 30, and further comprising the step of translating the data packets within a microcontroller operative as serial/USB translator.

33. A method according to claim 32, and further comprising the step of transmitting or receiving data packets over a serial communications line into or from a serial port of the computer simulator.

34. A method according to claim 32, and further comprising the step of transmitting data packets to or from the computer simulator along a serial communications link to the microcontroller and transmitting data packets to or from the USB host controller along a USB communications link using a USB protocol defined by the computer simulator.

35. A method according to claim 30, and further comprising the step of supporting within the microcontroller control, bulk, interrupt and/or isochronous USB transfer modes.

36. A method according to claim 30, and further comprising the step of controlling a serial and a USB peripheral by the microcontroller.

37. A method according to claim 30, and further comprising the step of translating data packets within a microcontroller operative as a USB/USB translator.

38. A method according to claim 37, and further comprising the step of controlling two USB peripherals by the microcontroller.

39. A method according to claim 37, and further comprising the step of transmitting or receiving data packets over a USB communications line into or from a USB host controller operative with the computer simulator.

40. A method according to claim 30, and further comprising the step of simulating a single ended zero and/or suspend mode by sending a flag to the host device.

* * * * *

UNITED STATES PATENT AND TRADEMARK OFFICE
CERTIFICATE OF CORRECTION

PATENT NO. : 6,769,622 B1  
APPLICATION NO. : 10/389113  
DATED : August 3, 2004  
INVENTOR(S) : Tournemille et al.

Page 1 of 1

It is certified that error appears in the above-identified patent and that said Letters Patent is hereby corrected as shown below:

Column 1, Line 36    Delete: "depending of"  
Insert: -- depending on --

Column 1, Line 59    Delete: " CSM "  
Insert: -- GSM --

Column 6, Line 58    Delete: " implementation One"  
Insert: -- implementation. One --

Column 7, Line 63    Delete: "USB, SERIAL"  
Insert: -- USB–SERIAL --

Column 8, Line 2    Delete: "isynchronous"  
Insert: -- isochronous --

Column 8, Line 20    Delete: "isynchronous"  
Insert: -- isochronous --

Column 9, Line 18    Delete: "USA"  
Insert: -- USB --

Column 9, Line 22    Delete: "isynchronous"  
Insert: -- isochronous --

Signed and Sealed this

Thirtieth Day of January, 2007

JON W. DUDAS  
*Director of the United States Patent and Trademark Office*